United States Patent [19]

Dauvillier et al.

[11] Patent Number: 4,864,196
[45] Date of Patent: Sep. 5, 1989

[54] LINE SCANNING AND ACCELERATING VOLTAGE GENERATING CIRCUIT

[76] Inventors: Richard Dauvillier, 13, rue des Agglomérés, 92000 Nanterre; Henri Giordano, 13, Av. Léon Sorbier, 91210 Draveil, both of France

[21] Appl. No.: 170,479

[22] Filed: Mar. 21, 1988

[30] Foreign Application Priority Data

Mar. 20, 1987 [FR] France .................. 87 03898

[51] Int. Cl.⁴ .................. H01J 29/70; H01J 29/76
[52] U.S. Cl. .................. 315/408; 315/395
[58] Field of Search .................. 315/408, 395

[56] References Cited

U.S. PATENT DOCUMENTS 4,381,477 4/1983 Bergmans .................. 315/408
4,572,994 2/1986 Valkestijn et al. .................. 315/408

OTHER PUBLICATIONS

Taub, Line Deflection/EHT Generator Circuit for CRT Display, IBM Technical Disclosure Bulletin, vol. 22, No. 8A, Jan. 1980, p. 3380.

*Primary Examiner*—Theodore M. Blum

[57] ABSTRACT

A line scanning circuit supplying a sawtooth current to a deflection coil and producing auxiliary voltages by way of a transformer. The currents through the coil and the windings of the transformer are both switched simultaneously by the same interrupter, but these inductances are separated by diodes and are each associated with an arrangement formed by a diode and a retrace capacitor to supply the current during the line retrace and the beginning of the trace of the scan. The transformer and the coil are fed independently of each other to allow a variation of the scanning amplitude without a change of the E.H.T.

6 Claims, 2 Drawing Sheets

4,864,196

LINE SCANNING AND ACCELERATING VOLTAGE GENERATING CIRCUIT

BACKGROUND OF THE INVENTION

The invention relates to a line scanning and accelerating voltage generating circuit for a cathoderay tube, including a transformer for supplying an accelerating voltage, a winding of which is connected between a power supply source and a semi-conductor interrupter element, which is also connected to a magnetic deflection coil and to first arrangement formed by a first retrace capacitor and a first diode, this arrangement forming a current path parallel to that of the interrupter, said diode being conductive in a direction opposite to that of the interrupter, the circuit further including a separation diode interposed between the transformer and the deflection coil, and connected such that the interrupter current is allowed to pass, and a second arrangement formed by a second retrace capacitor and a second diode, this second arrangement being connected to the electrode of the separation diode remote from the interrupter.

Such a circuit is intended for use in monitors for the display of alphanumerical texts and/or synthetic images.

The document FR-A-2,493,651 discloses a circuit which corresponds to the circuit described in the above opening paragraph. The problem to be solved in said document is to prevent over-oscillations and linearity errors, but does not consider the problem of obtaining several standards of different line amplitudes.

SUMMARY OF THE INVENTION

The invention has for its object to provide an arrangement in which the same monitor can be used as screen terminal for several data processing systems, these systems having different characteristics which, more specifically, necessitate the supply for the monitor of diffeline scanning amplitudes depending on the data processing system associated therewith, while of course, preserving a constant accelerating voltage for the cathode-ray tube.

Therefore, according to the invention, the circuit is characterized in that the deflection coil is connected to a second power supply source different from the first power supply source to which the transformer is connected.

For the case in which the difference between the voltage on the transformer and that on the coil can be inverted according to the modes of operation, it is advantageous to provide a second separation diode which is arranged in series with the first separation diode in the link extending from the deflection coil to the transformer, the two separation diodes being opposite to each other, the interruptor element being connected to the junction point of these two diodes and in that each of the two arrangements of a retrace capacitor and a diode is connected to the electrode of one of the two separation diodes remote from the junction point of these diodes.

To ensure an "S" linearity correction, it is customary to include a capacitor which is simply arranged in series with the deflection coil. In the present case, however, this coil is connected to a voltage source and it is not possible to proceed in the known manner. It has been found that it is nevertheless possible to ensure an S correction when the end of the deflection coil connected to the second power supply source is also connected to a terminal of an S capacitor whose other terminal is connected to ground, a further diode being arranged between the second power supply source and the coil.

An advantageous embodiment is characterized in that the electrode of the second diode which is remote from the deflection coil is connected to a d.c. voltage produced by means of the transformer.

The use of a circuit in accordance with the invention is particularly interesting when the different modes of operation considered all have the same scanning frequency or at least frequencies close thereto. Thus, in substantially all cases, the same line trace and retrace periods are preserved and two different scanning amplitudes can be obtained with the aid of a controllable voltage from the second supply source, means being provided for selecting this voltage from at least two different values.

BRIEF DESCRIPTION OF THE DRAWINGS

The following description which is given by way of non-limitative example with reference to the accompanying drawings will make it better understood how the invention can be put into effect.

DETAILED DESCRIPTION OF THE INVENTION

The embodiment described hereinafter relates to the case in which use is made of the same display tube, with its associated circuits, to provide on the one hand, a "minitel" function, by means of which it is possible to display data received by telephone in response to locally chosen parameters, and, on the other hand, to serve as a monitor for a microcomputer of a so-called "compatible PC" type.

Figure 1A:
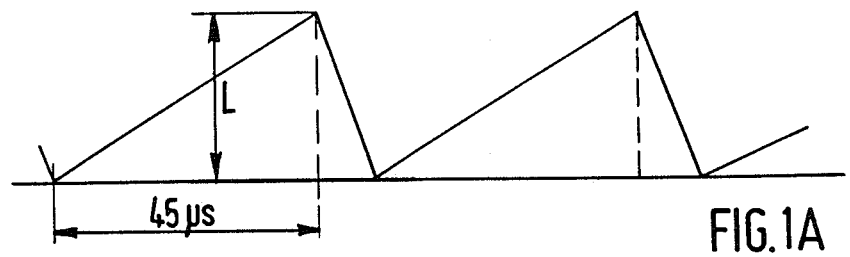
FIGS. 1A and 1B show scanning current waveforms to illustrate a specific problem for which the circuit according to the invention provides a solution.

From the hardwave point of view, this means that scans in accordance with the following standards must be possible;

FIG. 1A illustrates the scanning current required by the monitor of the microcomputer. Its repetition rate is 18,432 Hz for 369 lines per field (approximately corresponding to a field frequency of 50 Hz). The total period of the signal is 54.25 μs. The useful portion of the trace period, that is to say the period in which the video processor of the microcomputer supplies data, has a duration of 45 μs. A retrace period of 8.4 μs is provided, which consequently leaves a small margin of 0.85 μs for the trace. The amplitude of the image width displayed on the sceen is proportional to the quantity L indicated in the Figure.

Figure 1B:
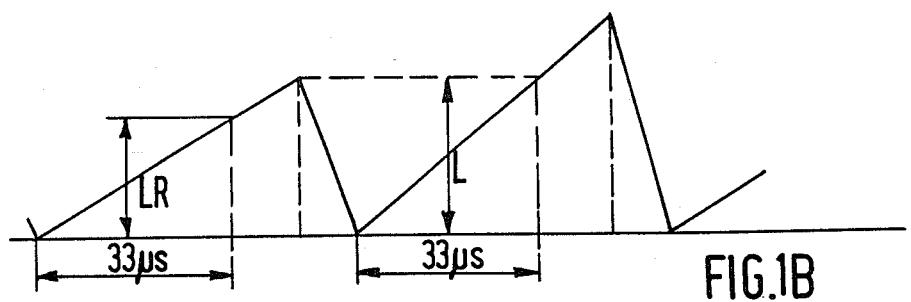

To simplify the embodiment, the aim has been to preserve approximately the same scanning frequency when used in the minitel mode, this to avoid all switching actions for the line oscillator and also for the power stage. Therefore, the choice was made, always to simplify the embodiment, to use already existing software for the management of the data processing operations in minitel, and also the corresponding video processor. The latter is designed to supply 312 lines at a rate of 50 Hz. i.e. a scanning frequency of 15,600 Hz. To bring this frequency close to the frequency obtained in the above-described mode, the clock of the microprocessor has simply to be accelerated, in such manner as to obtain substantially 60 fields per second. A line frequency of 18,720 Hz is then obtained. But the useful period of the normal minital (50 Hz) is 40 µs and the useful period of the processor thus accelerated by 20% is consequently $33\frac{1}{3}$µs. The left hand part of FIG. 1B shows the same sawtooth as FIG. 1A: with a useful period of approximately 33 µs, the useful width is indicated by LR: it is much smaller than in the other case and at the right of the screen there is a relatively wide unused band. To obtain a satisfactory image, it is necessary for the scan to have obtained at the end of a 33 µs period the same amplitude as for the case illustrated by FIG. 1A. A scan satisfying this condition is shown at the right in FIG. 1B: it supplies the same width L as in the FIG. 1A at the end of only 33 µs. Its maximum amplitude is consequently approximately 45/33 times larger than in the case illustrated in FIG. 1A. It will be obvious that all the other parts of the display device must remain unchanged, and, more specifically, the accelerating voltages of the cathode ray tube.

Figure 2:
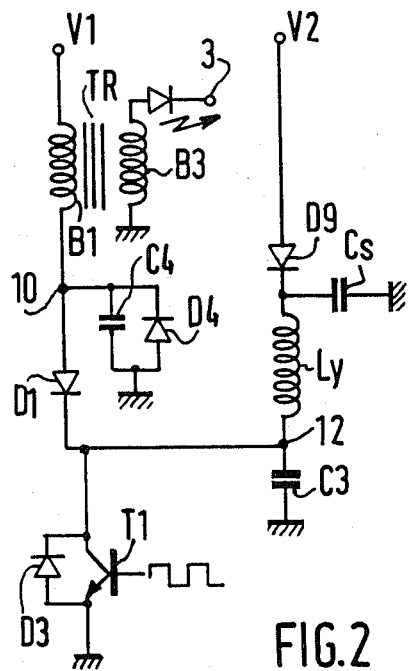
FIG. 2 is a simplified circuit diagram of a first embodiment of the invention.

The circuit diagram of FIG. 2 shows that the primary winding B1 of a transformer TR is connected to a power supply source V1, a secondary winding B3 of transformer TR being provided for supplying at a terminal 3 the extra high accelerating tension for the cathode-ray tube (in this case: 12 kV). Winding B1 is connected via a diode D1 to the collector of a npn-transistor T1 whose emitter is connected to ground and which constitutes an interrupter. Its base is controlled at the line frequency by a prior art circuit, not shown. This interrupter controls the current of a deflection coil Ly one end of which is also connected to the collector of transistor T1 and whose other end is connected to ground via a capacitor Cs which provides the S correction. Let it be assumed for the moment that diode D1 is short-circuited. When transistor T1 is rendered nonconductive, the magnetizing current of transformer TR and that of deflection coil Ly can, at the beginning of the so-called retrace period, continue to circulate in a retrace capacitor C3 which is in parallel with transistor T1. In known manner, this current rapidly changes its direction while an overvoltage develops and applies the extra high tension to the ends of B3, after which the current can flow in the other direction through a diode D3 which is arranged in parallel with transistor T1 and whose conductivity direction is opposite to that of the transistor. A current flows through diode D3 at the beginning of the trace period until the instant where it reverses and flows through transistor T1 which has again been rendered conductive in the meantime. The assembly formed by capacitor C3 and diode D3 constitutes a current path in parallel with that of interrupter T1.

However, a separation diode D1 is arranged between the primary winding B1 of transformer TR and the deflection coil Ly, i.e. between the points 10 and 12 of the FIG. 2. In the example shown in FIG. 2, transistor T1 is connected to this diode at the side of coil Ly, and the cathode of the diode faces the transistor in such a manner as to permit the passage of the main current from the interrupter T1.

Diode D1 prevents the current flowing through capacitor C3 and through diode D3 at the end of the retrace period from reaching the transformer TR. To ensure a current functioning during the corresponding periods, a second assembly formed by a retrace capacitor C4 and a diode D4 is added and is connected between the active end of the winding B1 of the transformer TR and ground. Therefore, this second assembly plays with the self-inductance of the primary winding B1 the same part as the first assembly, but the first assembly plays the part now only for the deflection coil Ly. The circuit as described up to now might work, but its operation would substantially be the same without the elements D1, C4, D4. The circuit includes also the following arrangement: the end of the deflection coil Ly, opposite to the end connected to the interrupter, is connected to a voltage source V2, which differs from the voltage source V1 to which the transformer TR is connected. Diode D1 prevents the source V2 from applying a current to the transformer TR. The portion comprising the deflection coil Ly then operates from the voltage V2 and the portion producing the accelerating voltage is operated by the source V2. It is then possible to have V2 vary without any variation of the accelerating voltage at the terminal 3.

In order to obtain an S correction, coil Ly is not connected directly to the supply voltage V2: a diode D9 is arranged in series with the supply voltage and an S-capacitor is connected between the coil and ground.

This arrangement functions without any problems on the condition that the voltage, at least during the retrace periods, is higher on coil Ly than on the primary winding B1 of the transformer, so that the diode D1 is blocked.

A further embodiment (not shown but which differs little from the embodiment of FIG. 2) is possible according to the same definition. While diode D1 is still connected between the transformer and the coil, the interrupter element T1 may be connected to this diode D1 on the transformer side (at point 10). Then the diode D1 has to be connected in the sense opposite to that shown in FIG. 2. In this case, the diode D3 associated with transistor T1 is connected to point 10 and diode D4 is superfluous and but, on the other hand, it is necessary to provide a diode in parallel with C3. This embodiment is satisfactory for the opposite case as described in the foregoing, that is to say now for the case in which the voltage is always lower on the coil than on the transformer.

Figure 3:
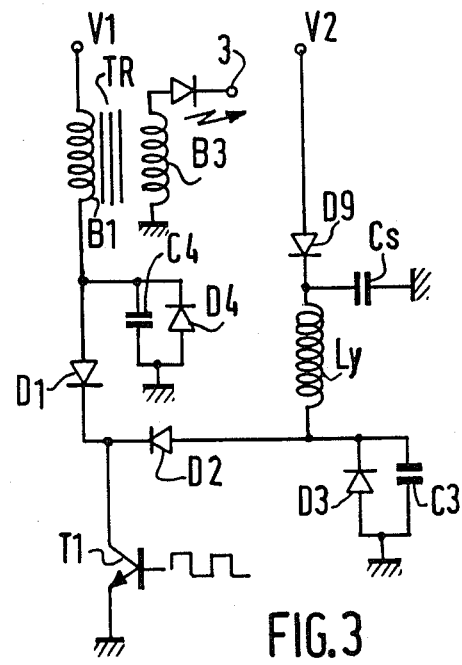
FIG. 3 is a simplified circuit diagram of a second embodiment of the invention.

It may now happen, more specifically when one utilizes certain available components, for example the deflection coil Ly, that for certain values desired for the supply voltage V2, the voltage will be much higher on the coil Ly than on the transformer TR while for other values of voltage V2, the opposite occurs. The circuit diagram of FIG. 3 provides a solution for this case. It comprises the same components as those in FIG. 2, which have been given the same reference numerals, but a second separation diode D2 is added. It is arranged between the deflection coil Ly and the interrupter element T1. The first assembly formed by diode D3 and capacitor C3 is connected to the anode of diode D2, that is to say on the side opposite to the junction point of the two diodes D1 and D2, and similarly, the assembly C4–D4 is connected to the anode of diode D1. The two diodes D1 and D2 conduct in opposite directions and their direction of connection renders it possible for their currents to flow through transistor T1 connected to their junction point.

The transistor T1 may comprise an integrated retrace diode. For that reason, diode D3 is shown in FIG. 2 directly at the electrodes of the transistor T1. In the circuit diagram of FIG. 3, it is necessary to separate diode D3 from transistor T1 by the diode D2. With the circuit diagram of FIG. 3, the voltage V2 can be chosen freely with respect to the voltage V1.

Figure 4:
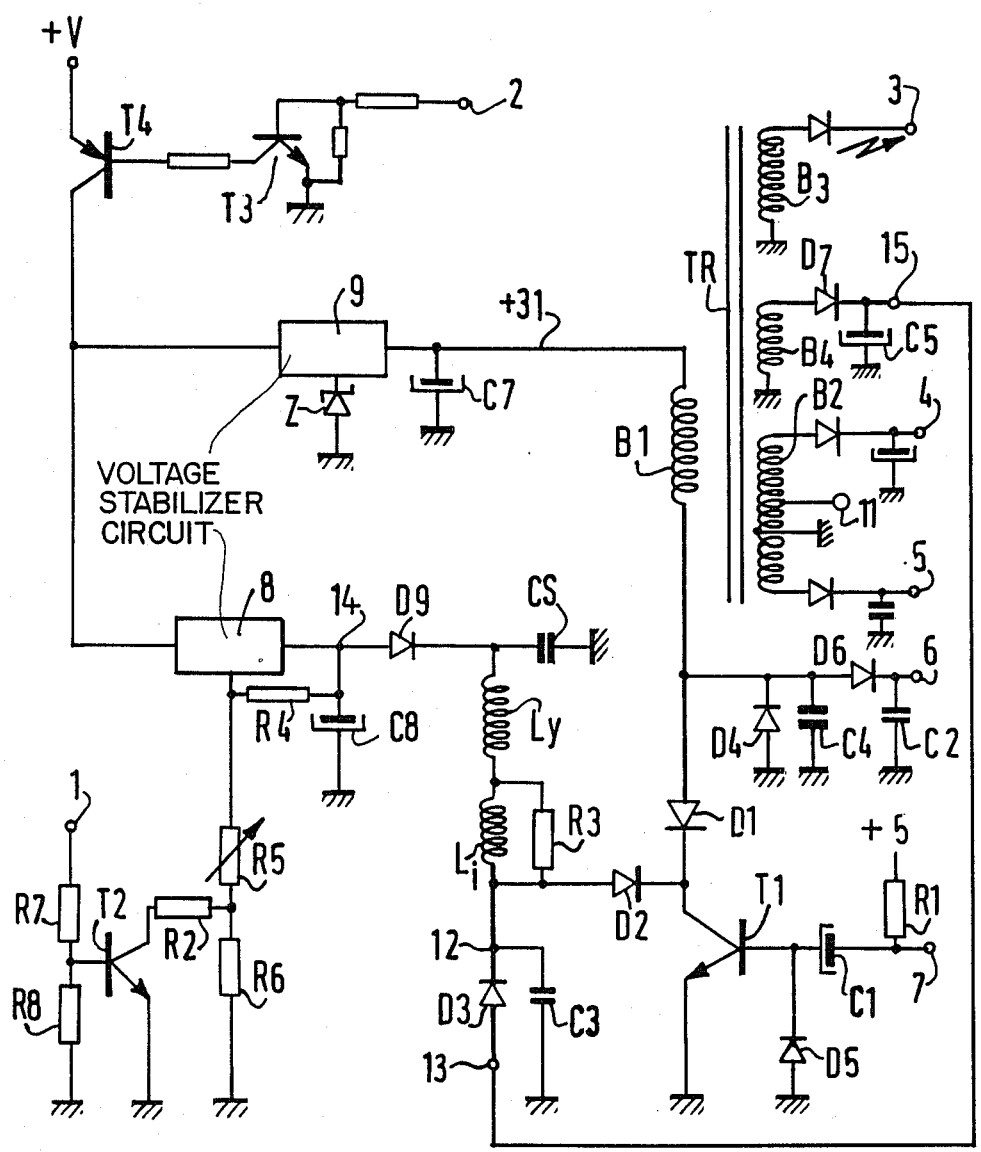
FIG. 4 is a detailed circuit diagram of the embodiment shown in FIG. 3.

FIG. 4 is a detailed representation of a preferred embodiment of the invention. Two integrated voltage stabilizer circuits 8 and 9 are fed from a positive voltage source +V. A pnp-transistor T4 arranged in series with the source +V enables cutting off of the power supply to obtain a so-called "stand-by" state. Transistor T4 is controlled in customary manner by another transistor T3 whose base is connected to a terminal 2 of the stand-by control.

The integrated stabilizer circuit 9 applies a fixed voltage of 31 volts to a storage capacitor C7. In the absence of a type producing a sufficient voltage, a Zener diode Z is included to determine a voltage at a reference terminal of the circuit 9. The voltage +31 is applied to the winding B1 of transformer TR. The latter has a secondary winding B3 already mentioned in the foregoing whose rectified voltage supplies the E.H.T. on terminal 3. A further secondary winding B2 supplies, in known manner, auxiliary voltages at terminals 4, 5, 11. The elements D4, C4, D1, T1 correspond to those shown in FIG. 3. Use is made of the retrace overvoltages at the terminals of the primary winding B1 to apply an additional auxiliary supply voltage, via a diode D6, to a storage capacitor C2 and a terminal 6.

Transistor T1 is controlled in known manner by a coupling capacitor C1 and a d.c. component recovery diode D5 from a control terminal 7 which is connected to an integrated circuit, not shown, for example of the commercially available type TEA 2037A, a resistor R1 being connected between a five-volt power supply +5 and terminal 7.

The integrated stabilizer circuit 8 applies a voltage to a storage capacitor C8 and feeds coil Ly and the S correction capacitor Cs across the diode D9. These elements are the same as those of FIG. 3. A linearity inductance Li, which is arranged in parallel with a resistor R3, is arranged in series with coil Ly.

Finally, the elements D2, D3, C3, are the same as those in FIG. 3: let it be assumed for the moment that the terminal 13 is connected to ground.

The integrated stabilizer circuit 8 produces a voltage which is a function of the division value of a resistive divider which, between the output terminal 14 and ground is constituted by series-arranged resistors R4, R5, R6. A transistor T2, arranged in series with a resistor R2, is connected between the junction point of resistors R5 and R6 and ground and has for its object to change the division value of the divider and consequently of the voltage produced by the integrated stabilizer circuit 8. The base of transistor T2 is controlled by a divider R7, R8 from a terminal 1 of control mode, whose levels are suitable for TTL circuits. When the voltage at 1 is high, transistor T2 is conductive and resistor R2 is arranged in parallel with R6. This case corresponds to the "minitel" mode. If the voltage at 1 is low, the base of the voltage control divider is constituted by R5 in series with R6 and the voltage at terminal 14 is then lower: this case corresponds to the "compatible PC" mode. Moreover, the resistor 5 is adjustable, which renders it possible to further control the voltage. In the first part of the trace of the scan, the current in diode D3 generates a (negative) voltage of approximately -0.06 volts on the connection 12. When, thereafter, the current flows via the diode D2 and transistor T1, this voltage is, on the contrary, positive. Introducing diode D2 in series with transistor T1 raises the voltage, which may reach a value of approximately +1.5 volts, in the case in which transistor T1 is of the Darlington type. When these supply voltages are relatively low, the voltage difference at the ends of the deflection coil Ly between the start and the end of the trace is unpermissible.

This difficulty is resolved by the fact that the diode D3, i.e. the diode which is arranged in parallel with the retrace capacitor C3, is connected at its side remote from the deflection coil, to the terminal 13 which is connected to a terminal 15 carrying a positive d.c. supply voltage generated by a winding B4 of the transformer TR, a diode D7 and a capacitor C5. Thanks of this arrangement, the voltage on the connection 12 is raised, during the start of the trace of the scan. It must of course be avoided that current can flow from the relevant voltage source via the elements D3, D2, T1 when T1 is conductive. Its voltage is therefore limited in practice to a value slightly lower than the sum of the threshold of saturation voltages of these elements D3, D2, T1.

The transformer TR is of a type which is designed in such a manner as to provide the highest primary inductance compatible with obtaining the customary tuning to the third harmonic.

It should be noted that a two-collector power transistor alone could take over the role of transistor T1 and the two diodes D1 and D2: one of its collectors would then be connected to the transformer TR and the other collector to the deflection coil Ly.

The following choices for the elements yielded good results:

| | | | |
|---|---|---|---|
| $R_1$ | 100 Ω | $C_1$ | 2,2 μF |
| $R_2$ | 24 kΩ | $C_2$ | 22 nF |
| $R_3$ | 1 kΩ | $C_3$ | 15 nF |
| $R_4$ | 390 Ω | $C_4$ | 15 nF |
| $R_5$ | 2.2 kΩ adjustable | | |
| $R_6$ | 6.8 kΩ | $C_7$ | 47 μF |
| $R_7$ | 22 kΩ | $C_8$ | 47 μF |
| $R_8$ | 10 kΩ | $C_9$ | 1.8 μF |
| D1 to D4 | | | BYD 335 |
| D5 | | | 1N4148 |
| D6, D7 | | | BYD 335 |
| T1 | | | BU 806 |
| T2 | | | BC 548 B |
| T3 | | | BC 548 C |
| T4 | | | BD 136 |
| Z | | | BZX55 C6V8 |
| 8 | | | LM317 variable regulator |
| 9 | | | 78 M 24 fixed regulator |

Ly = RT 1077/04A deflection unit
Li = AT 4042/46
voltage on the terminal 11:2 volts

What is claimed is:

1. A line scanning and accelerating voltage generating circuit for a cathode-ray tube, including a transformer for supplying an accelerating voltage, a winding of which is connected between a power supply source and a semiconductor interrupter element, which is also connected to a magnetic deflection coil and to a first arrangement formed by a first retrace capacitor and a first diode, this first arrangement forming a current path parallel to that of the interrupter, said first diode being conductive in a direction opposite to that of the interrupter, the circuit further including a first separation diode coupled between the transformer and the deflection coil, and being conductive in the same direction as that of the interrupter current, and a second arrangement formed by a second retrace capacitor and a second diode, this second arrangement being connected to the electrode of the first separation diode remote from the interrupter, characterized in that the deflection coil is connected to a second power supply source different from the first power supply source to which the transformer is connected.

2. A circuit as claimed in claim 1, characterized in that said circuit further comprises a second separation diode which is arranged in series with the first separation diode in the link extending from the deflection coil to the transformer, the first and second separation diodes being opposite to each other, the interruptor element being connected to the junction point of the first and second separation diodes and in that each of the first and second arrangements of a retrace capacitor and a diode is connected to the electrode of one of the first and second separation diodes remote from the junction point of the first and second separation diodes.

3. A circuit as claimed in claim 1, characterized in that the end of the deflection coil connected to the second power supply source is also connected to a terminal of an S capacitor whose other terminal is connected to ground, a further diode being arranged between the second power supply source and the coil.

4. A circuit as claimed in claim 1, characterized in that the voltage supplied by the second power supply source is controllable, means being provided for selecting this voltage from at least two different values.

5. A circuit as claimed in claim 1, characterized in that the electrode of the first diode remote from the deflection coil is connected to d.c. voltage produced by means of the transformer.

6. A circuit as claimed in claim 2, characterized in that the end of the deflection coil connected to the second power supply source is also connected to a terminal of an S capacitor whose other terminal is connected to ground, a further diode being arranged between the second power supply source and the coil.

* * * * *